(12) United States Patent
Knall

(10) Patent No.: US 6,777,773 B2
(45) Date of Patent: *Aug. 17, 2004

(54) MEMORY CELL WITH ANTIFUSE LAYER FORMED AT DIODE JUNCTION

(75) Inventor: N. Johan Knall, Sunnyvale, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/186,359

(22) Filed: Jun. 27, 2002

(65) Prior Publication Data

US 2003/0021142 A1 Jan. 30, 2003

Related U.S. Application Data

(63) Continuation-in-part of application No. 09/928,969, filed on Aug. 13, 2001, which is a continuation-in-part of application No. 09/638,428, filed on Aug. 14, 2000, now abandoned.

(51) Int. Cl.[7] .............................................. H01L 29/00
(52) U.S. Cl. ......................... 257/530; 257/530; 257/50
(58) Field of Search .......................... 257/530, 50, 390; 438/690; 365/130, 113

(56) References Cited

U.S. PATENT DOCUMENTS

| | | | |
|---|---|---|---|
| 4,823,181 A | | 4/1989 | Mohsen et al. |
| 4,881,114 A | * | 11/1989 | Mohsen et al. ............. 257/530 |
| 5,311,039 A | * | 5/1994 | Kimura et al. ................ 257/50 |
| 5,561,315 A | * | 10/1996 | Van Dort ..................... 257/530 |
| 5,693,556 A | * | 12/1997 | Cleeves ...................... 438/600 |
| 6,150,705 A | * | 11/2000 | Chen .......................... 257/530 |
| 6,486,065 B2 | * | 11/2002 | Vyvoda et al. ............. 438/690 |
| 6,515,888 B2 | * | 2/2003 | Johnson et al. ............. 365/130 |

* cited by examiner

Primary Examiner—David Nelms
Assistant Examiner—Thinh T. Nguyen
(74) Attorney, Agent, or Firm—Blakely, Sokoloff, Taylor & Zafman LLP

(57) ABSTRACT

A memory cell for a three-dimensional intergrated circuit memory is disclosed. The cell includes a very highly doped semiconductor regions with a doping level of $10^{20}$ atoms $cm^{-3}$ or higher. An antifuse region is disposed between the heavily doped region and a more lightly doped region.

8 Claims, 2 Drawing Sheets

MEMORY CELL WITH ANTIFUSE LAYER FORMED AT DIODE JUNCTION

This application is a continuation-in-part of co-pending U.S. patent application Ser. No. 09/928,969, filed Aug. 13, 2001, which is a continuation-in-part of U.S. patent application Ser. No. 09/638,428, filed Aug. 14, 2000 abn.

REFERENCE TO RELATED APPLICATIONS

"Same Conductivity Type Highly-Doped Regions For Antifuse Memory Cell," filed Jun. 27, 2002, Ser. No. 10/185,515, and "Electrically Isolated Pillars in Active Devices," filed Jun. 27, 2002, Ser. No. 10/185,507.

PRIOR ART

Three-dimensional memories, including memories fabricated with cells having antifuse layers, have been described in several prior art publications. Such publications include U.S. Pat. Nos. 5,835,396; 6,034,882; and PCT/US01/13575, filed Apr. 25, 2001.

In the process of fabricating three-dimensional memories, improvements to the cells have been discovered which enhance the cells' performance and manufacturability.

SUMMARY OF THE INVENTION

A memory cell for use in a three-dimensional memory having a plurality of such cells disposed at several levels above a substrate is disclosed. Each cell includes a first region of a first conductivity type doped to a level of at least $1 \times 10^{20}$ atoms cm$^{-3}$. A second region of a second conductivity type is also used. An antifuse region is disposed between the first and second regions such that when the antifuse region is breached, a diode is formed. This occurs when the cell is programmed. In one embodiment, the very heavily doped first conductivity type region is a P type region, and the second region is an N type region doped to a level of approximately $1 \times 10^{17}$ atoms cm$^{-3}$.

DETAILED DESCRIPTION

A memory cell for use in a three-dimensional memory is described. The cell comprises first and second regions of opposite conductivity type with an antifuse layer disposed between them. One of the regions is very heavily doped. In the following description, numerous specific details are set forth, such as, layer thicknesses, etc. in order to provide a thorough understanding of the present invention. It will be apparent to one skilled in the art that the present invention may be practiced without these specific details. In other instances, well-known fabrication techniques are not described in detail, in order not to unnecessarily obscure the present invention.

Figure 1:
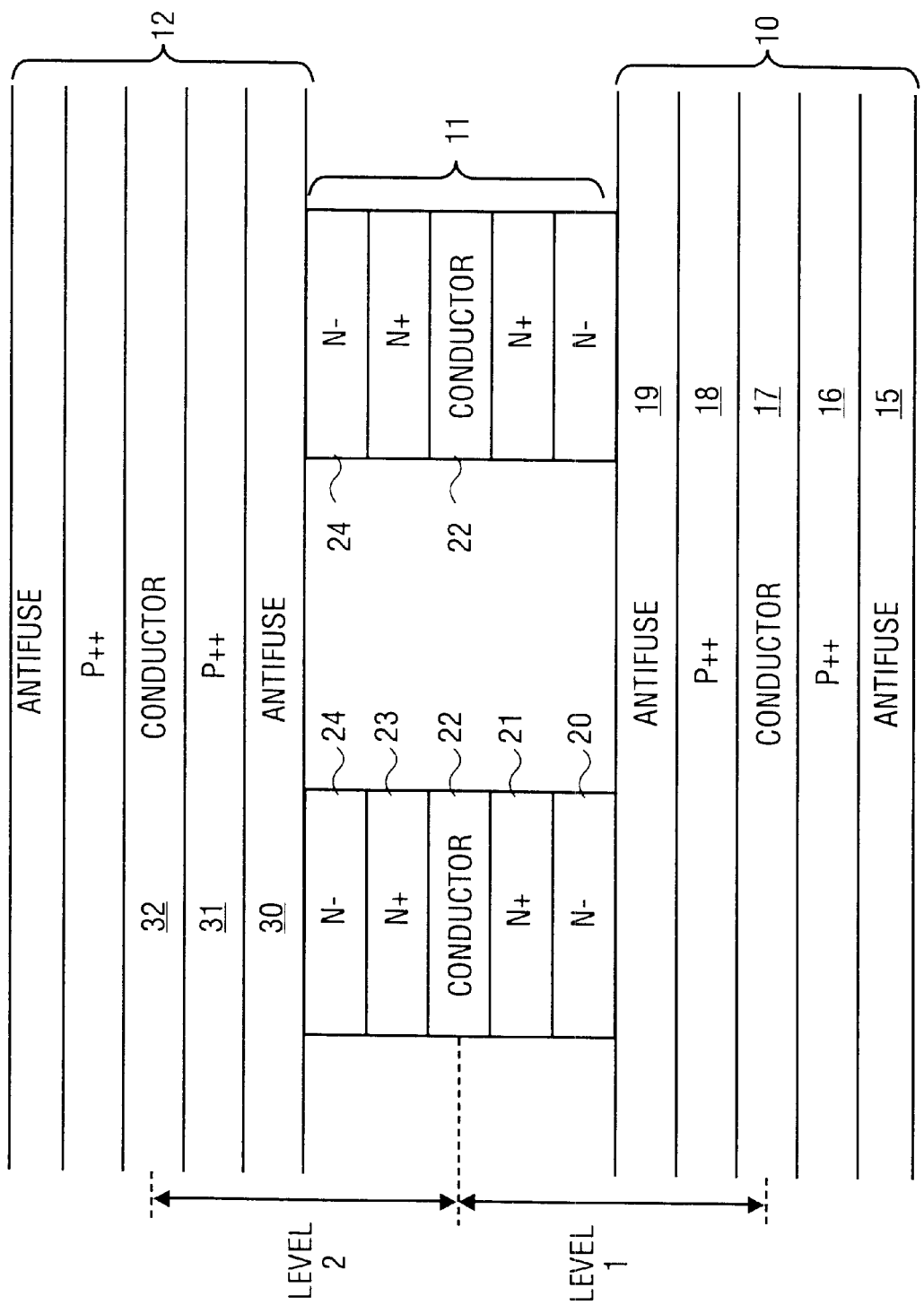
FIG. 1 is a cross-sectional elevation view of a portion of a memory array in accordance with an embodiment of the present invention.

Referring now to FIG. 1, a portion of a memory which includes memory cells in accordance with one embodiment of the present invention is illustrated. The memory is fabricated from a plurality of rail-stacks, three of which are shown as rail-stacks 10, 11, and 12. In the memory, there are a plurality of such spaced-apart, rail-stacks at each level of rail-stacks in the memory.

Two complete levels of memory cells are shown in FIG. 1, specifically memory cell levels 1 and 2. Other memory cell levels may be fabricated above and below the levels shown in FIG. 1. Each memory level includes a plurality of memory cells disposed between conductors.

Typically, the memory array is fabricated on a monocrystalline silicon substrate with the peripheral circuits formed in the substrate as is described in the above cited references. The rail-stacks are formed above the substrate and make contact to the peripheral circuits through vias which extend to substrate regions.

The rail-stack 10 comprises an antifuse region 15, a P++ semiconductor region 16, a conductor 17, a P++ semiconductor region 18, and an antifuse region 19. The doped regions of the rail-stacks may be formed from polysilicon layers or other semiconductor materials.

The antifuse regions 15 and 19 may be silicon dioxide regions, and for the embodiment shown are deposited regions, having a thickness in the range of 20–50 Å. In other embodiments, the antifuse regions may be grown from an underlying silicon layer.

In one embodiment, the thickness of each P++ region 16 and 18, is approximately 500 Å. Region 18 may be formed from a layer which is initially substantially thicker, and which is planarized resulting in a reduction in thickness.

The conductor 17 may be a metal layer, and in one embodiment, comprises a silicide such as a titanium silicide. The silicon for forming the silicide may be consumed from the regions 16. The conductor may have a thickness of approximately 500 Å.

Importantly, the regions 16 and 18 are very heavily doped, for the embodiment illustrated, with a P type dopant such as boron. Doping of at least $1 \times 10^{20}$ atoms cm$^{-3}$ is used and this doping may be as high as, or greater than, $1 \times 10^{21}$ atoms cm$^{-3}$. The reason for this very high doping level is discussed later.

The rail-stacks 11 are fabricated from several layers which include in the center region, conductors 22. These conductors may be similar to the conductor 17 of rail-stack 10. Above and below the conductor 22 are N+ regions 21 and 23, which may have a thickness of approximately 500 Å. Above and below the regions 21 and 23 are the N− regions 20 and 24, respectively. These regions may have a final thickness of approximately 2,000 Å.

Regions 21 and 23 may be doped to a level of approximately $1 \times 10^{19}$ atoms cm$^{-3}$ or greater, with an N type dopant such as phosphorous. Region 21 provides silicon for silicide conductor 22 and thus is initially thicker. Both regions 21 and 23 provide for increased conductivity between the conductor and the more lightly doped N− regions 20 and 24. The regions 20 and 24 may have a doping level of approximately $1 \times 10^{17}$ atoms cm$^{-3}$. The layer from which the region 24 is formed may be initially substantially thicker, for instance, 3,500 Å, since this layer may be planarized prior to the deposition of the layers that form the rail-stacks 12.

The rail-stack 12 is the same as rail-stack 10, and consequently may include the same layers with the same thicknesses and doping levels as those used for rail-stack 10.

As mentioned, in FIG. 1, there are two levels of memory cells illustrated. Two memory cells are illustrated between the conductors 22 and 32, and two memory cells are illustrated between the conductors 22 and 17. For the illustrated embodiment, each memory cell includes a P++ region and an N− region with an antifuse layer disposed between these two regions.

Once the memory cell is programmed for one binary state, the antifuse layer is breached and the memory cell becomes a diode having a P++ region and N− region. In the other binary state, the antifuse layer remains intact. Note that the diodes, when formed for the illustrated embodiment, are all of the same type, that is, all are P++/N− diodes. Additionally for the illustrated embodiment, when the diodes are programmed, the current flow for the memory cells in both levels 1 and 2, flows into the conductor 22 from the conductors 17 and 32. The diodes may alternatively be fabricated so that they all "point" in the same direction in the memory. For instance, the anode of each diode may be above its cathode.

Figure 2:
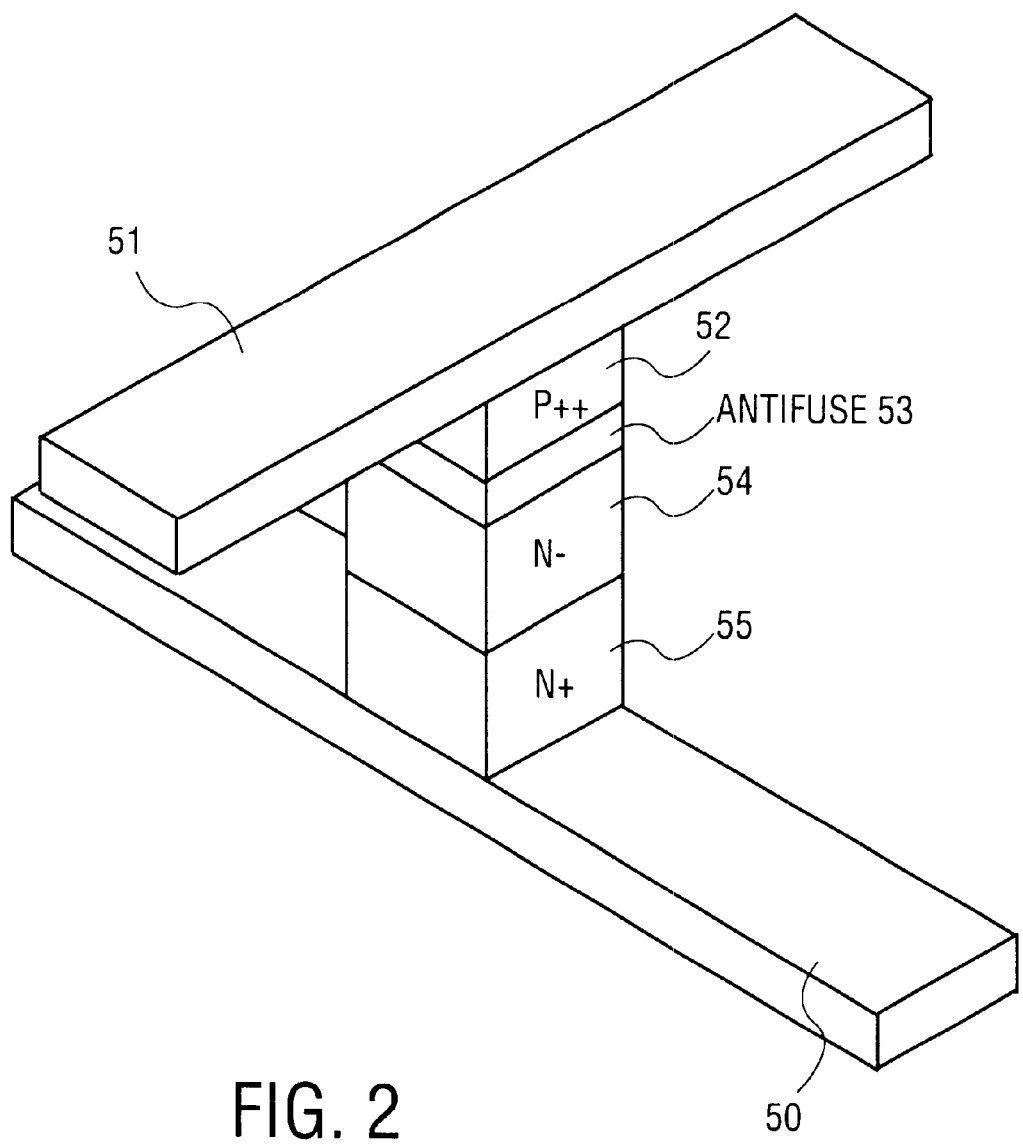
FIG. 2 is a perspective view of a single memory cell in accordance with an alternate embodiment of the present invention.

Importantly, for the memory cells of FIGS. 1 and 2, one of the semiconductor regions used to form the diode of the cell is very heavily doped. As mentioned, doping levels in excess of $1 \times 10^{21}$ atoms $cm^{-3}$ may be used. It has been found that having one of these regions very heavily doped results in memory cells having a more uniform resistance once programmed. Additionally, this resistance is lower than expected even considering the very heavily doped region. In one embodiment, the very heavily doped regions are achieved using in-situ doping. However, other techniques such as ion implantation or a combination of ion implantation in in-situ doping may be used.

While in the above embodiment, the very heavily doped region is a P++ region, and the other region is an N− region, cells may be fabricated having an N++ region and a P− region. In this case, the N++ region is doped to a level of at least $1 \times 10^{20}$ atoms $cm^{-3}$, or even as high as, or higher than, $1 \times 10^{21}$ atoms $cm^{-3}$. Again, in-situ doping or ion implantation may be used to obtain this high doping.

In the embodiment of FIG. 2, a single memory cell is shown disposed between the orthogonal, spaced-apart conductors 50 and 51. A plurality of such cells is used at a plurality of levels to form a memory array. Again, the cell includes a very heavily doped region, P++ region 52, and an N− region 54 with an antifuse region 53 disposed between the regions 52 and 54. An N+ region 55 is used to provide improved conductivity between region 54 and the conductor 50. The doping level for region 52 is at least $1 \times 10^{20}$ atoms $cm^{-3}$, and even as high as, or higher than, $1 \times 10^{21}$ atoms $cm^{-3}$. The thicknesses of the regions in FIG. 2 may be the same as the thicknesses of the corresponding regions for the memory cells of FIG. 1. When the cell of FIG. 2 is programmed, a diode is formed between the conductors at the junction of the regions 52 and 54.

The primary difference between the cells of FIG. 1 and the cell of FIG. 2 is that in FIG. 2 the cell is formed as a pillar structure, whereas in FIG. 1, the cells are formed at the intersection of the rail-stacks.

The cell of FIG. 2, as was the case of the cells in FIG. 1, may be fabricated with an N++ region to form a diode once the cell is programmed.

Thus, a memory cell for use in a three-dimensional memory array has been described where one of the regions associated with the formation of a diode is a very heavily doped region.

What is claimed is:

1. A three-dimensional memory having a plurality of memory cells disposed at several layers above a substrate, each cell comprising:

a first polysilicon region of a first conductivity type, doped to a level of at least $1 \times 10^{20}$ atoms $cm^{-3}$;

a second polysilicon region of a second conductivity type doped to a level of approximately $1 \times 10^{17}$ atoms $cm^{-3}$; and an antifuse region disposed between the first and second regions such that when the antifuse region is breached, a diode is formed at the junction of the first and second regions.

2. The memory defined by claim 1, wherein the antifuse region of the memory cell is between 20–50 Å thick and formed from silicon dioxide.

3. The memory defined by claim 1, wherein the first region of each memory cell is doped to a level of approximately $1 \times 10^{21}$ atoms $cm^{-3}$ or greater.

4. The memory defined by claim 1 or 2, wherein the first conductivity type of the memory cells is P type, and the second conductivity type of the memory cells is N type.

5. In a three-dimensional memory having a plurality of memory cells on a plurality of levels where each memory cell includes a silicon dioxide region disposed between a first polysilicon region and a second polysilicon region of opposite conductivity type to the first polysilicon region, and where the silicon dioxide layer is breached when the cell is programmed for one binary state, an improvement in memory cell wherein the first polysilicon region is doped to a level in excess of $1 \times 10^{20}$ atoms $cm^{-3}$ and the second polysilicon region is doped to a level or approximately $1 \times 10^{17}$ atoms $cm^{-3}$.

6. The improvement of claim 5, wherein the first polysilicon region is a P type region.

7. The improvement of claim 6, wherein the doping level of the first polysilicon region is approximately $1 \times 10^{21}$ atoms $cm^{-3}$ or greater.

8. The improvement of claims 5 or 7, wherein the silicon dioxide region is approximately 20–50 Å thick.

* * * * *